(12) United States Patent
Watanabe

(10) Patent No.: US 7,592,129 B2
(45) Date of Patent: Sep. 22, 2009

(54) METHOD FOR FORMING PHOTORESIST PATTERN AND METHOD FOR MANUFACTURING SEMICONDUCTOR DEVICE

(75) Inventor: Minoru Watanabe, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 489 days.

(21) Appl. No.: 11/366,385

(22) Filed: Mar. 3, 2006

(65) Prior Publication Data

US 2006/0199112 A1    Sep. 7, 2006

(30) Foreign Application Priority Data

Mar. 4, 2005    (JP) .............................. 2005-060796

(51) Int. Cl.
*G03F 7/26*    (2006.01)
(52) U.S. Cl. .................... 430/311; 430/325; 430/330
(58) Field of Classification Search ............... 430/311, 430/322, 325, 328, 330
See application file for complete search history.

(56) References Cited

U.S. PATENT DOCUMENTS

| 4,548,688 | A | * | 10/1985 | Matthews | ................ | 430/281.1 |
| 6,117,622 | A | * | 9/2000 | Eisele et al. | ................ | 430/328 |
| 2003/0228740 | A1 | * | 12/2003 | Nagai et al. | ................ | 438/484 |

FOREIGN PATENT DOCUMENTS

| JP | 07-122485 | 5/1995 |
| JP | 11-219886 | 8/1999 |

* cited by examiner

*Primary Examiner*—Kathleen Duda
(74) *Attorney, Agent, or Firm*—Volentine & Whitt, P.L.L.C.

(57) ABSTRACT

With the objective of suppressing resist pattern collapse generated at dry etching, energy rays are applied to a photoresist structure including an antireflection film provided on a base and a resist pattern brought into contact with the antireflection film, the resist pattern being a chemical-amplification photoresist provided on the antireflection film. Thereafter, the photoresist structure is heated at a heating temperature greater than or equal to a glass transition point of the resist pattern and less than a melting point thereof.

7 Claims, 4 Drawing Sheets

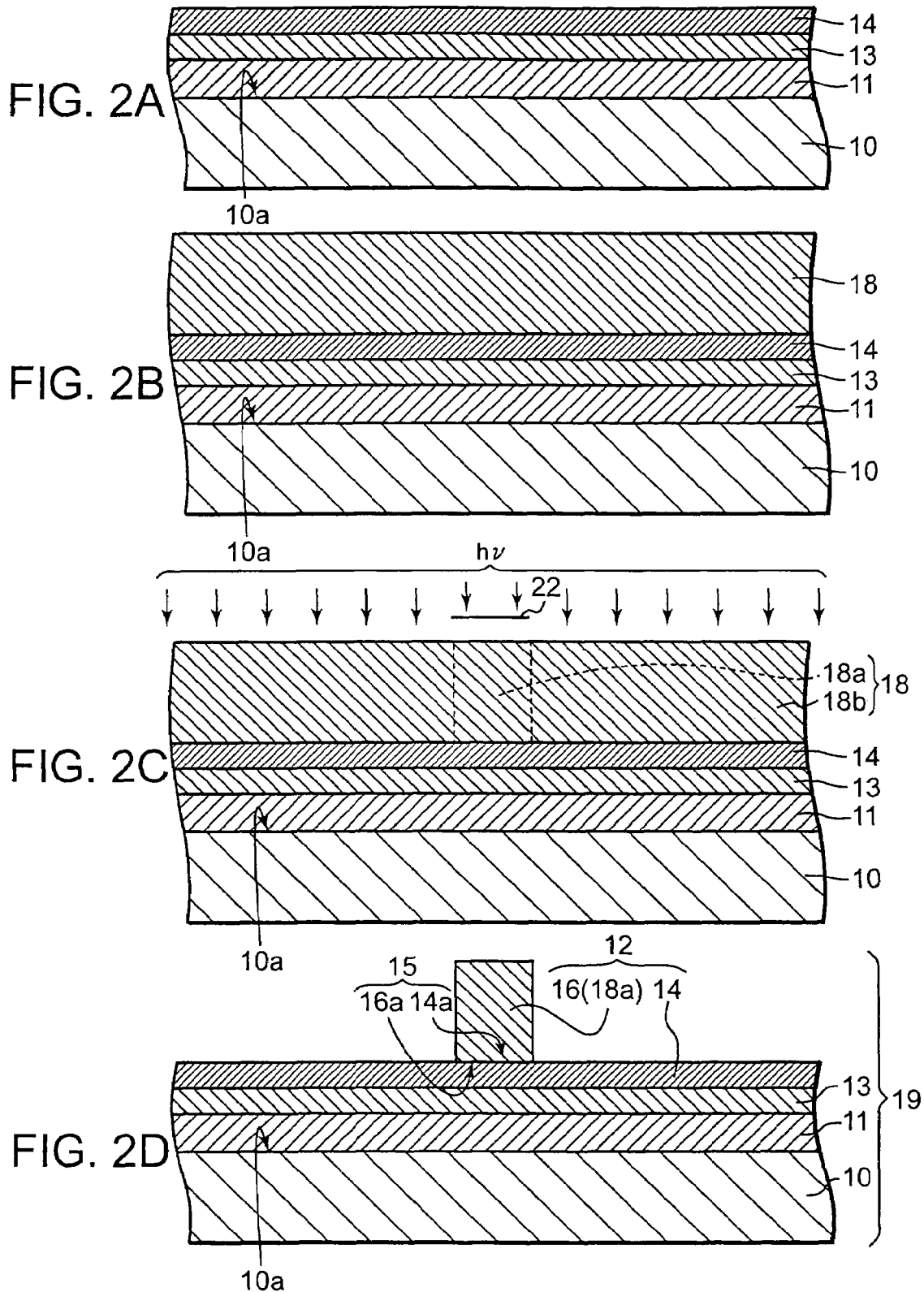

METHOD FOR FORMING PHOTORESIST PATTERN AND METHOD FOR MANUFACTURING SEMICONDUCTOR DEVICE

BACKGROUND OF THE INVENTION

The present invention relates to a method for forming a photoresist pattern and a method for manufacturing a semiconductor device using the photoresist pattern forming method.

With the development of a micro-fabrication technique, improvements in performance of a semiconductor device and its high integration have recently been in progress. The development of a semiconductor device based on a 65-90 nm design rule is currently underway. With miniaturization of the semiconductor device, various factors to yield reductions are becoming manifest in its manufacturing process. As one of the factors to the yield reductions, may be mentioned, collapse of a photoresist pattern.

The photoresist pattern collapse frequently occurs in, for example, a fine photoresist pattern high in aspect ratio, which is formed in a gate forming process step or the like. The photoresist pattern collapse mainly occurs upon (1) a rinse step in a lithography process step and upon (2) a dry etching step executed after the lithography process step.

It has already been clarified that the photoresist pattern collapse at the rinse process step is attributable to surface tension generated when rinse liquid (pure water) existing between adjacent photoresist patterns is dried. As a countermeasure against to it, there has been disclosed a technique for adding isopropyl alcohol for reducing surface tension to the rinse pure water (refer to, for example, a patent document 1 (Japanese Unexamined Patent Publication No. H5(1993)-285972 (1st page and FIG. 4).

There has also been disclosed a technique for compressing a photoresist film in its thickness direction at the time of pre-bake of a photoresist applied onto the entire surface of a substrate to suppress the photoresist pattern collapse at a rinse step, and enhancing the density of the photoresist film thereby to increase the mechanical strength of the photoresist (refer to, for example, a patent document 2 (Japanese Unexamined Patent Publication No. H 11 (1999)-219886 (1st page)).

However, the methods according to the patent document 1 and the patent document 2 respectively show that they are effective in preventing the collapse of the photoresist pattern at the rinse step but do not suggest a method for solving the photoresist pattern collapse generated at the dry etching step, whose cause is not yet clear.

SUMMARY OF THE INVENTION

The present invention has been made in view of such problems. It is therefore an object of the present invention to provide a method for forming a photoresist pattern, which is capable of suppressing photoresist pattern collapse that occurs at a dry etching step, and a method for manufacturing a semiconductor device.

According to one aspect of the present invention, for attaining the above object, there is provided a method for forming a photoresist pattern, comprising the steps of preparing a photoresist structure including an antireflection film provided over a base, and a resist pattern brought into contact with the antireflection film and comprised of a chemical-amplification photoresist provided over the antireflection film; applying energy rays to the photoresist structure; and thereafter heating the photoresist structure at a heating temperature greater than or equal to a glass transition point of the resist pattern and less than a melting point thereof.

According to the photoresist pattern forming method of the present invention, the energy rays are applied to the photoresist structure and thereafter heated at a predetermined temperature. It is thus possible to cure the resist pattern and increase a force for adhesion between the photoresist structure and the base.

In the present invention, the chemical-amplification photoresist includes an acidogenic agent which generates acid by irradiation of the energy rays such as ultraviolet rays. Owing to the action of acid generated from the acidogenic agent, the chemical-amplification photoresist proceeds in alkali solubilization of the photoresist and bridge reaction.

In the photoresist pattern forming method of the present invention, the energy rays are applied onto the photoresist structure and the photoresist structure already subjected to the irradiation of the energy rays is heated, whereby the corresponding photoresist pattern is formed.

Thus, the bridge reaction is estimated to proceed inside the resist pattern and between the resist pattern and the antireflection film. The thus-obtained photoresist pattern is cured and the force for adhesion to the base increases.

Consequently, even though dry etching relative to the base is thereafter performed with the photoresist pattern as a mask, the collapse of the photoresist pattern can be suppressed.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIGS. 2(A) through 2(D) are respectively process sectional views showing a process for manufacturing an Si substrate formed with a photoresist structure;

DETAILED DESCRIPTION OF THE PREFERRED EMBODIMENTS

Preferred embodiments of the present invention will be described with reference to FIGS. 1 through 4. Incidentally, the shape, size and physical relationship of each constituent element in the figures are merely approximate illustrations to enable an understanding of the present invention. While preferred configurational examples of the present invention are explained below, the composition of each constituent element and the numerical conditions or the like are nothing more than mere preferred examples. Accordingly, the present invention is not limited to the following embodiments.

First Preferred Embodiment

One preferred example of a method for manufacturing a semiconductor device, which includes a method for forming a photoresist pattern, according to a first embodiment, will be explained with reference to FIGS. 1 through 3.

Figure 1A:
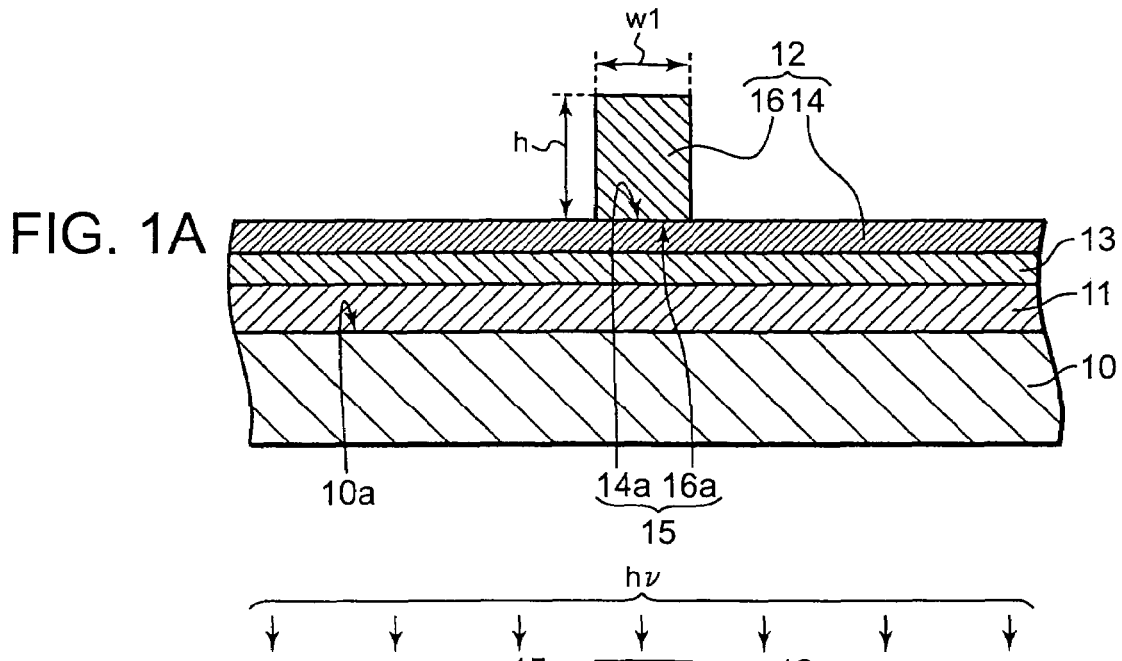
FIGS. 1(A) through 1(C) are respectively process sectional views showing a method for manufacturing a semiconductor device, according to a first embodiment of the present invention.
Figure 1B:
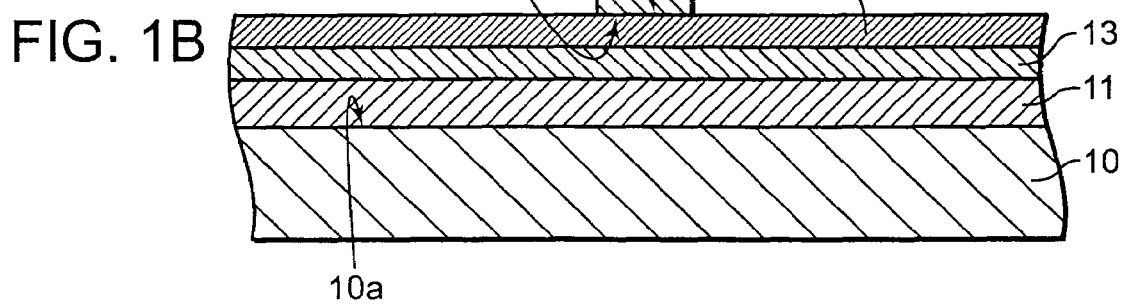
Figure 1C:
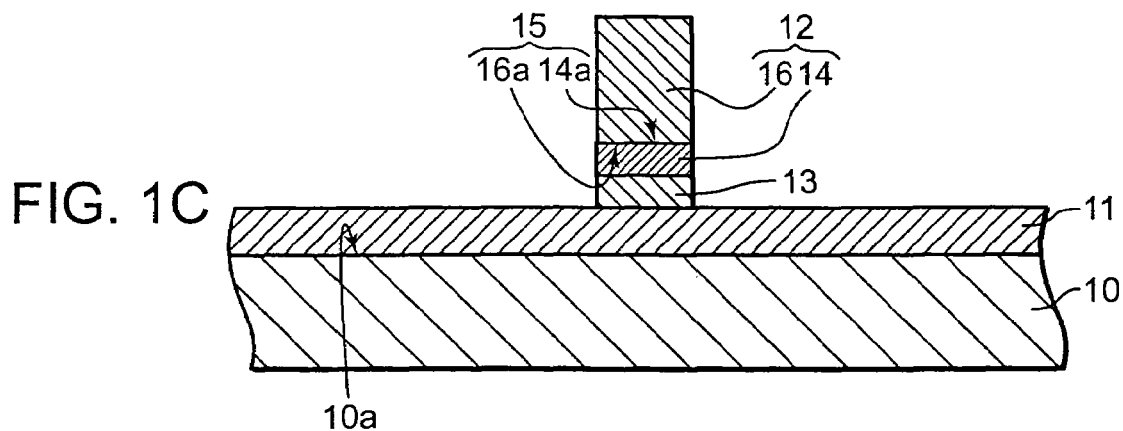

FIGS. 1(A) through 1(C) are respectively process sectional views showing one example of a process for manufacturing the semiconductor device. Incidentally, FIG. 1(A) shows steps subsequent to the completion of a development step and a rinse step, which are extracted from the semiconductor device manufacturing process in which a deposition or growth step, a lithography step and an etching step, and the like are repeated.

(1) Step for Preparing Substrate:

As shown in FIG. 1(A), an Si substrate 10 formed with a photoresist structure 12 is prepared.

The constructions of the photoresist structure 12 and the Si substrate 10 will now be explained in brief. Circuit elements fabricated in the process steps executed up to now and preliminary layers constituted as circuit elements in a subsequent step are formed on the side of a first main surface 10a of the Si substrate 10. The circuit elements and the preliminary layers are generically called "a device forming predetermined layer 11". Incidentally, the individual circuit elements are not shown because their drawings become cumbersome. A base or bed film 13 is deposited on the entire surface on the first main surface 10a side of the Si substrate 10 containing the device forming predetermined layer 11. The photoresist structure 12 includes an antireflection film 14 applied and formed over the upper entire surface of the base film 13, and a photoresist layer, i.e., a resist pattern 16 patterned on the antireflection film 14 in a predetermined shape. A lower surface 16a of the resist pattern 16 is in contact with an upper surface 14a (surface opposite to a surface of the antireflection film 14, which is brought into contact with the base film 13) of the antireflection film 14. Now, the contact surfaces of both 14 and 16 which respectively consist of the lower surface 16a of the resist pattern 16 and the upper surface 14a of the antireflection film 14, will now be called "a junction surface 15".

Here, the antireflection film 14 is set to such a thickness as to be capable of effectively preventing reflection of exposure light (KrF excimer laser light in the present embodiment) by the base film 13.

While the resist pattern 16 is formed in various shapes and sizes or dimensions depending upon circuit element design patterns of the semiconductor device, a gate region needs the pattern smallest in actual dimension in the circuit element design patterns. A width (gate length) W1 thereof is approximately 90 nm, for example. A thickness h of the resist pattern 16 is 400 nm, for example. Since the resist pattern 16 is isotropically reduced through processing in a subsequent process step as will be described later, the gate length W1 is formed wider than a design size (65 nm) in advance here. For example, a PHS (polyhydroxy styrene)-based positive-working chemical-amplification photoresist is used as the resist pattern 16.

The base film 13 is etched in a predetermined plane geometric form in a subsequent process step and formed as parts constituting circuit elements, such as a gate electrode, wiring, etc. In the present embodiment, the base film 13 is assumed to be a polysilicon film, for example.

Incidentally, the term of the resist pattern 16 "being patterned in predetermined form" means that the resist pattern 16 is formed in a shape congruent or similar to a plane geometric shape of each of circuit elements and wirings planned to be formed in the Si substrate 10.

Subsequently, a process for manufacturing the photoresist structure 12 formed in the Si substrate 10 will be explained with reference to FIG. 2. FIGS. 2(A) through 2(D) are respectively process sectional views showing the process for manufacturing the Si substrate 10 formed with the photoresist structure 12.

(a) An antireflection film 14 is formed on a base film 13. Described in more detail, an antireflection film solution is applied onto the base film 13 with a thickness of about 60 nm by a spin coater or the like. The thus-obtained applied layer is dried at a temperature of about 90° C. and thereafter baked at a temperature of about 180° C. Thus, the corresponding antireflection film 14 is formed over the entire surface of the base film 13 (see FIG. 2(A)).

(b) A positive-working chemical-amplification resist layer 18 is formed on the antireflection film 14. For example, the above-described PHS-based positive resist is used as the positive-working chemical-amplification photoresist. Described in more detail, a positive-working chemical-amplification photoresist solution is applied with a thickness of about 400 nm by the spin coater or the like. The thus-obtained applied layer is pre-baked at a temperature of about 100° C. Thus, the corresponding positive-working chemical-amplification resist layer 18 is formed over the entire surface of the antireflection film 14 (see FIG. 2(B)).

(c) Thereafter, the positive-working chemical-amplification resist layer 18 is exposed to light. Described in more detail, a mask 22 formed with an aperture in a predetermined pattern is disposed in an opposing relationship to the Si substrate 10. Exposure light is applied through the mask 22 to perform exposure, whereby a mask pattern is transferred to the positive-working chemical-amplification resist layer 18. Described more specifically, a halftone mask whose optical transmittance is about 6% is disposed over the Si substrate 10 by using a KrF excimer laser exposure device whose numerical aperture NA is 0.6 and having 0, ⅔ annular illumination. KrF excimer laser (whose wavelength: 248 nm) is applied with an energy amount of about 30 mJ/cm$^2$. Thus, protons are generated from an acidogenic agent contained in the positive-working chemical-amplification resist in a region 18b irradiated with the exposure light. The protons release a protecting group of each main chain (PHS). Thus, the region 18b irradiated with the exposure light becomes soluble in alkali (see FIG. 2(C)). On the other hand, an unexposed region 18a of the positive-working chemical-amplification resist layer 18 is a region insoluble in alkali.

(d) After the completion of exposure, post exposure bake (PEB) of the positive-working chemical-amplification resist layer 18 is carried out. Described in more detail, the positive-working chemical-amplification resist layer 18 is heated at a temperature of about 100° C. by using a hot plate. Consequently, the reaction of releasing the protecting group from the main chain (PHS) is accelerated in the region 18b irradiated with the exposure light.

(e) After the completion of PEB, the positive-working chemical-amplification resist layer 18 is developed. That is, it is developed through the use of tetramethyl ammonium hydroxide (TMAH) containing 30 w % to remove an unnecessary or disused portion (alkali-soluble region 18b) of the positive-working chemical-amplification resist layer 18. Thus, the alkali-insoluble region 18a remains on the antireflection film 14. The region 18a corresponds to the resist pattern 16 having the predetermined plane geometric shape. Consequentially, the photoresist structure 12 comprising the resist pattern 16 and the antireflection film 14 is formed (see FIG. 2(D)). Incidentally, a structure having the photoresist structure 12 on the Si substrate 10, which is shown in FIG. 2(D), is called an intermediate structure 19.

(f) After the completion of its development, the resist pattern 16 is rinsed. Described in more detail, the intermediate structure 19 is attached to the spin coater and pure water drops onto the resist pattern 16 while the intermediate structure 19 is being rotated. The pure water is added with isopropyl alcohol which reduces surface tension. The pure water having dropped onto the resist pattern 16 moves the surface of the resist pattern 16 to the outer peripheral portion of the intermediate structure 19 by a centrifugal force derived from the rotation of the intermediate structure 19. Thus, impurities that have remained in the resist pattern 16 are removed.

Thus, the corresponding Si substrate 10 formed with the photoresist structure 12 on the upper side of the rinsed intermediate structure 19 is obtained through the steps of (a) through (f).

(2) Energy Ray Irradiation Step:

Subsequently, energy rays are radiated into the photoresist structure 12 as shown in FIG. 1(B). Described in more detail, ultraviolet rays are applied to the photoresist structure 12 at a radiation illuminance of, for example, about 220 mW/cm$^2$ using a high pressure mercury lamp capable of generating the ultraviolet rays lying over a wavelength range from at least 250 to 450 nm. Thus, protons are generated from the acidogenic agent that remains in the resist pattern 16. The protons release a protecting group of each main chain (PHS). Along with it, bridge reaction occurs between the main chains (PHS), so that the free volume of PHS polymer that constitutes the resist pattern 16 is decreased. Incidentally, each released protecting group results in, for example, gas such as carbon dioxide. Hence the protecting groups are released from the resist pattern 16. Thus, the resist pattern 16 is cured and isotropically shrunk (reduced in volume) with the progress of bridge reaction, the release of the protecting group due by gasification and the decrease in free volume. Consequently, the resist pattern 16 rises to glass transition temperatures that exceed 150° C.

(3) Heating Step:

Subsequently, the photoresist structure 12 irradiated with the ultraviolet rays is heated at a heating temperature greater than or equal to the glass transition point of the resist pattern 16 and less than its melting point. Described in more detail, the photoresist structure 12 is placed on its corresponding hot plate heated to 350° C. for about 90 seconds. Thus, the release of each protecting group by gasification and the bridge reaction both described in the above energy ray irradiation step are accelerated and the shrinkage and curing of the resist pattern 16 proceed. With the heating on this condition, finally, the width W1 of the resist pattern 16 is shrunk to about 65 nm (design size) and its thickness h is shrunk to about 360 nm.

(4) Dry Etching Step:

Thereafter, the base film 13 is dry-etched with the resist pattern 16 as an etching mask (see FIG. 1(C)). Described in more detail, dry etching is performed using a RIE (Reactive Ion Etching) method. That is, an etching chamber of a RIE apparatus is set as a positive polarity and the Si substrate 10 is set as a negative polarity, and a high frequency (13.56 MHz) is applied between the two. Thus, $CF_4$ (gas pressure: about 10 Pa) used as a reaction gas is brought into plasma form. A region uncovered with the resist pattern 16 of the base film 13 is removed by such plasma.

By repeating the respective steps of the above (1) to (4) according to the design of the semiconductor device, the corresponding semiconductor device is obtained.

In the semiconductor device manufacturing method of the present embodiment, the collapse of the resist pattern 16 is not observed upon the dry etching of the step (4).

Figure 3A:
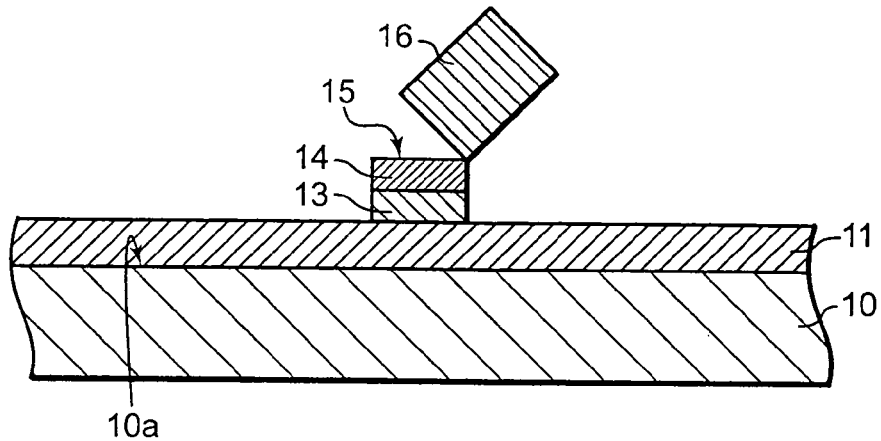
FIGS. 3(A) through 3(C) are respectively sectional views typically showing the manner of collapse of a resist pattern.
Figure 3B:
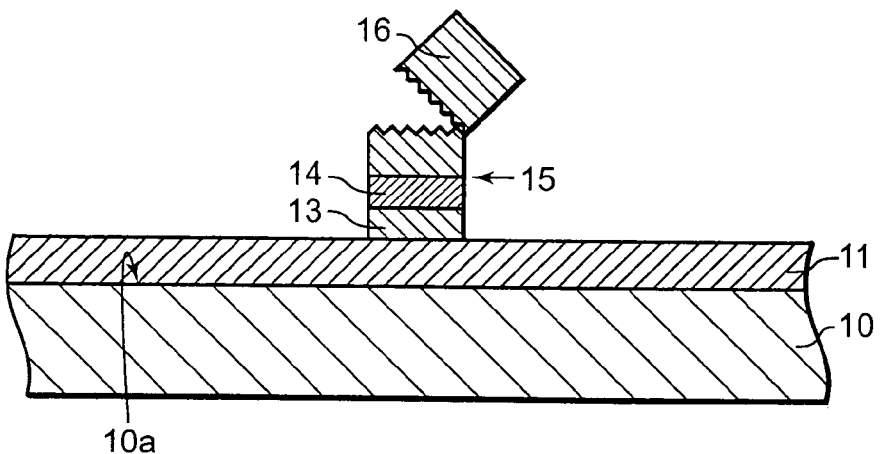
Figure 3C:
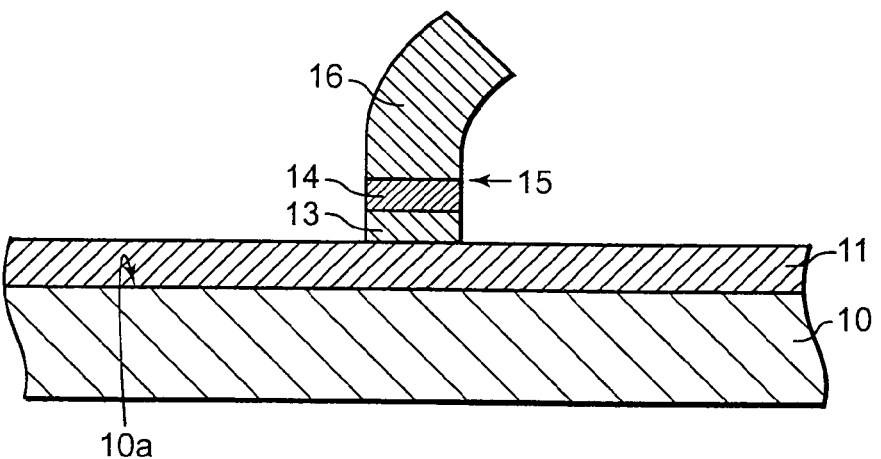

The collapse of the resist pattern 16 at the dry etching, which corresponds to the conventionally known problem, can be classified broadly into three types. A description will be made of the manner of collapse of the resist pattern 16 with reference to FIGS. 3(A) through 3(C). FIGS. 3(A) through 3(C) are respectively sectional views typically showing the manner of collapse of the resist pattern 16. In FIGS. 3(A) through 3(C), structures similar to FIG. 1 are given the same reference numerals and their explanations will be omitted.

(i) As shown in FIG. 3(A), the resist pattern 16 is collapsed by peeling from the junction surface 15 (hereinafter also called "(i) type collapse").

(ii) As shown in FIG. 3(B), the resist pattern 16 is collapsed by being broken off halfway (hereinafter also called "(ii) type collapse").

(iii) As shown in FIG. 3(C), the resist pattern 16 is collapsed by being bent halfway (hereinafter also called "(iii) type collapse").

It is suggested from (i) that the force for adhesion between both the resist pattern 16 and the antireflection film 14 at the junction surface 15 therebetween is insufficient as the cause of collapse of the resist pattern 16. Similarly, it is suggested from (ii) and (iii) that the mechanical strength of the resist pattern 16 itself lacks as the cause of collapse of the resist pattern 16.

In the semiconductor device manufacturing method of the present embodiment, two points shown below are cited where the reason why the collapse of the resist pattern 16 is suppressed, is estimated on the basis of the collapsed causes suggested from the manner of collapse of the resist pattern 16.

(A) Increase in Mechanical Strength of Resist Pattern 16 Per Se:

The resist pattern 16 is irradiated with the ultraviolet rays in the step (2), and the resist pattern 16 is heated in the step (3). As a result, the bridge reaction proceeds in the resist pattern 16. Thus, the resist pattern 16 is isotropically shrunk and cured. It is estimated that the mechanical strength of the resist pattern 16 increases due to the bridge reaction and hence the aforementioned (ii) type and (iii) type collapses are suppressed.

(B) Bridge or Cross-link between Resist Pattern 16 and Antireflection Film 14:

In the step (2), there is a possibility that the bridge reaction will occur between the resist pattern 16 and the antireflection film 14 upon irradiation of the ultraviolet rays. That is, some bridge reaction beyond the junction surface 15 occurs between the main chain (PHS) of the resist pattern 16 in the neighborhood of the junction surface 15 and the main chain of the antireflection film 14 in the neighborhood of the junction surface 15. As a result, it is estimated that the force of adhesion between the antireflection film 14 and the resist pattern 16 increases and hence the (i) type collapse is suppressed. Incidentally, the result of experiment suggesting that the force of adhesion between the antireflection film 14 and the resist pattern 16 has increased in an experimental example to be described later, is shown with respect to this point.

In the semiconductor device manufacturing method as described above, the collapse of the resist pattern 16 at the dry etching is suppressed by virtue of the construction that the photoresist structure 12 is irradiated with the ultraviolet rays and then heated. Setting the heating temperature in the step (2) to a temperature (ranging from 150 to 360° C.) higher than a temperature (less than 150° C.) generally used in the process step of heating the photoresist makes it possible to effectively cure the resist pattern 16.

Incidentally, the antireflection film 14 can make use of an organic one having composition which can cause a bridge reaction between the antireflection film 14 and the resist pattern 16 with the irradiation of the ultraviolet rays in the step (2).

For example, one containing a film forming resin (base resin), a light-absorption component for absorbing light reflected from the base film 13, and a crosslinking agent as components can be used. Described in more detail, as the antireflection film 14, may be mentioned, for example, one containing a crosslinking agent substituted with hydroxyalkyl group or alkoxylalkyl group, a benzophenon, diphenylsulfonic or sulfoxide light-absorption component, and a base resin corresponding to an acrylic resin.

As the antireflection film 14, one containing a film forming resin (base resin) with absorbance introduced therein, and a crosslinking agent as components can be used. As the antireflection film 14, may be mentioned, for example, one containing quinolinyl group, quinolinyl derivative group having ring substitutional group with N, O or S as a hetero atom, a base resin containing phenantorenyl group, acrydinyl group or alkylenantryl group, and a crosslinking agent such as glycoluryl, and one containing a base resin obtained by polymerizing dye having substitutional group having an antracene ring, a napthalane ring, etc. into an epoxy resin, and crosslinking agents such as a melamic resin, a uremic resin, benzoquanamic resin, a glycoluryl resin, etc.

Although polysilicon is used as the material for the base film 13 in the present embodiment, the base film 13 may be formed by using, for example, an optional and suitable material corresponding to any of $SiO_2$, phosphosilicate glass (PSG), a metal (Al or the like), $Si_3N_4$, etc.

The chemical-amplification resist that constitutes the resist pattern 16 is not limited to the positive type but may use a negative type. By doing so, the collapse of the resist pattern at the dry etching can be suppressed even in the case of the negative-working chemical-amplification resist.

In the step (2), an electron beam may be used as the energy rays to be irradiated. By doing so, the resist pattern 16 per se can be cured and the bridge reaction can be generated between the resist pattern 16 and the antireflection film 14 in a manner similar to the ultraviolet rays, thus making it possible to suppress the collapse of the resist pattern 16 at the dry etching.

Although the high pressure mercury lamp is used as the light source for the ultraviolet rays in the step (2), the light source is not limited to the high pressure mercury lam but may make use of an optional and suitable light source of a low pressure mercury lamp, a metal halide lamp, an ultra-high pressure mercury lamp which applies g radiation or rays (wavelength:365 nm), etc.

In the step (2), an optional and suitable irradiation apparatus such as an exposure device, a cure device used for curing a photoresist, or the like can be used as the device for applying the ultraviolet rays to the photoresist structure 12.

In the step (3), the device for heating the photoresist structure 12 is not limited to the hot plate but can make use of known various heating devices. For example, a coater or the like used in the already-existing semiconductor device manufacturing process can be used.

The dry etching in the step (4) is not limited to RIE if physical etching is taken. For example, sputter etching, plasma etching or the like may be used.

Incidentally, the ultraviolet rays radiated in the step (2) are not limited to one having a continuous wavelength ranging from 250 to 450 nm. Ultraviolet radiation having an arbitrary single wavelength in the wavelength range from 250 to 450 nm may be adopted. Incidentally, when the wavelength of ultraviolet radiation to be applied is longer than 450 nm or shorter than 250 nm, this is undesirable because light-absorption efficiency of an acidogenic agent is reduced and no bridge reaction proceeds inside the resist pattern 16 and between the resist patter 16 and the antireflection film 14.

In the step (2), the radiant intensity of the irradiated ultraviolet radiation may preferably be such intensity as to merely allow the bridge reaction to occur between the resist pattern 16 and the antireflection film 14. When the radiant intensity of the ultraviolet rays is excessively weak, the ultraviolet rays do not reach the junction surface 15 and the bridge reaction proceeds only in the neighborhood of the surface of the resist pattern 16. Therefore, it is not desirable. When the ultraviolet's radiant intensity is excessively strong, the resist pattern 16 is foamed due to gas released from the inside of the resist pattern 16 and ruptured in the worst case, thus leading to the occurrence of particles. Therefore, it is not desirable. Described more specifically, the radiant intensity of the ultraviolet radiation may preferably be from over 200 $mW/cm^2$ to under 700 $mW/cm^2$. Radiating the ultraviolet rays having such a radiant intensity makes it possible to cause the bridge reaction to occur inside the resist pattern 16 and between the resist pattern 16 and the antireflection film 14 and suppress the collapse of the resist pattern 16 at the dry etching.

The heating temperature in the step (3) is not limited to 350° C. if it is greater than or equal to the glass transition point of the resist pattern 16 and less than its melting point. When the heating temperature is less than the glass transition point, the bridge reaction is little accelerated inside the resist pattern 16 and between the resist pattern 16 and the antireflection film 14. Therefore, such a case is not desirable. When the heating temperature is greater than or equal to the melting point, it is not desirable because the resist pattern 16 is thermally deformed. Since the suitable range of the heating temperature differs according to the type of a photoresist to be used, it all depends. In the case of the positive-working chemical-amplification photoresist employed in the present embodiment, however, the heating temperature may preferably be set to temperatures from over 150° C. to under 360° C. By doing so, the bridge reaction inside the resist pattern 16 and between the resist pattern 16 and the antireflection film 14 can be accelerated. Hence the collapse of the resist pattern 16 at the dry etching can be suppressed. More preferably, the heating temperature may be set to temperatures from over 200° C. to under 360° C. Doing so makes it possible to accelerate the bridge reaction inside the resist pattern 16 and between the resist pattern 16 and the antireflection film 14 more promptly.

The time necessary for heating in the step (3) may be a time interval required to merely make it possible to sufficiently accelerate the bridge reaction inside the resist pattern 16 and between the resist pattern 16 and the antireflection film 14. When the heating time is taken excessively short, the bridge reaction is little accelerated inside the resist pattern 16 and between the resist pattern 16 and the antireflection film 14. Therefore, such a case is not desirable. Taking the heating time long excessively is not desirable because throughput in the step (3) is degraded. A suitable range of the heating time may preferably be set between 30 seconds and 180 seconds in consideration of these factors.

If the photoresist structure 12 can be held for a constant time (30 to 180 seconds) at a temperature ranging from 150 to 360° C. in the step (3), then the photoresist structure 12 may be heated along a predetermined temperature profile.

The steps (2) and (3) may be performed in this order, and no restriction is imposed on the time interval from the completion of the step (2) to the execution of the step (3).

The steps (2) and (3) may be carried out simultaneously. By doing so, the time necessary for the steps (2) and (3) can be shortened and throughput in these steps is hence improved. It is however better to avoid the execution of heating (step (3))

from the early stage of the irradiation of ultraviolet rays (step (2)). That is, there is a fear that since the bridge reaction of the photoresist structure 12 does not proceed sufficiently when heating is conducted from immediately after the start of the ultraviolet-ray irradiation, the photoresist structure 12, particularly, the resist pattern 16 is thermally deformed.

EXPERIMENTAL EXAMPLES

Experimental examples will be shown each of which suggests that a force for adhesion between the antireflection film 14 and the resist pattern 16 has increased by going through the steps (2) and (3).

First Experimental Example

Figure 4:
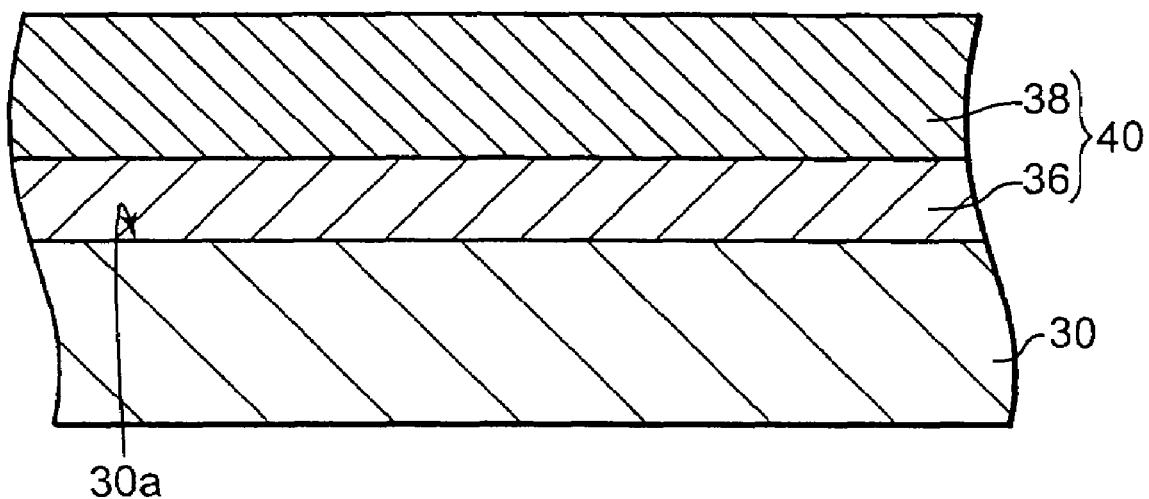
FIG. 4 is a sectional view of a sample employed in an experimental example.

A sample used in the experiment will be explained with reference to FIG. 4. FIG. 4 is a sectional view of the sample.

A bare Si wafer 30 (hereinafter called wafer 30) unformed with circuit elements and the like is prepared.

Then, the above steps (a) and (b) are executed to deposit or grow an antireflection film 36 and a positive-working chemical-amplification resist layer 38 over a first main surface 30a of the wafer 30 in this order. A structure comprising the antireflection film 36 and the positive-working chemical-amplification resist layer 38 is referred to as a photoresist structure model layer 40 below. Here, the thickness of the antireflection film 36 and the thickness of the positive-working chemical-amplification resist layer 38 are respectively similar to the first embodiment.

Subsequently, the post exposure bake in the step (d) is executed without executing the exposure (step (c)). Here, the condition for execution of the post exposure bake is similar to the first embodiment.

The above steps (2) and (3) are then executed. Here, the conditions for execution of the steps (2) and (3) are similar to the first embodiment.

Thus, the sample 1 (wafer 30) is obtained wherein the photoresist structure model layer 40 is formed over the first main surface 30a.

Subsequently, a force for adhesion between the photoresist structure model layer 40 and the first main surface 30a was measured. The adhesive force was measured using a scratch method. Described in more detail, a diamond probe is pushed and pressed vertically to the photoresist structure model layer 40 of the wafer 30. Under such a condition, the load placed on the diamond probe is gradually increased while the wafer 30 is being moved at equal speed in a horizontal direction. A peel-minimum load is measured in accordance with acoustic emission generated when the photoresist structure model layer 40 is peeled from the first main surface 30a, after which it is defined as an adhesive force. Incidentally, a nano-scratch tester was used as a measuring device, and the load placed on the diamond probe was changed in a range from 0.1 to 30 mN. A moving distance (measured distance) of the wafer 30 is about 3 cm.

As a result, the adhesive force relative to the first main surface 30a of the photoresist structure model layer 40 was 3.39 mN in the sample 1.

Second Experimental Example

A sample 2 was fabricated in a manner similar to the (first experimental example) except for the non-execution of the steps (2) and (3). A force for adhesion between a photoresist structure model layer 40 and a first main surface 30a was measured.

As a result, the adhesive force relative to the first main surface 30a of the photoresist structure model layer 40 was 1.68 mN in the sample 2.

It became clear from the (first experimental example) and (second experimental example) that the force of adhesion between the photoresist structure model layer 40 and the first main surface 30a increased by heating the photoresist structure model layer 40 comprised of the antireflection film 36 and positive-working chemical-amplification resist layer 38 at a temperature greater than or equal to the glass transition point of the positive-working chemical-amplification resist layer 38 and less than its melting point after the irradiation of ultraviolet rays (first experimental example).

The meaning of "the adhesive force increases" will now be considered. The adhesive force mentioned here can more strictly be considered to be equivalent to the sum of (1) the force of adhesion between the antireflection film 36 and the first main surface 30a and (2) the force of adhesion between the antireflection film 36 and the positive-working chemical-amplification resist layer 38.

Meanwhile, the (1) type collapse, i.e., the collapse (see FIG. 3(A)) derived from the peeling of the resist pattern 16 at the junction surface 15 was not confirmed in the step (4) of the first embodiment. Thus, it is suggested that when the (experimental examples) and the first embodiment are taken into consideration, the force for adhesion between the antireflection film 36 and the positive-working chemical-amplification resist layer 38 also contributes to an increase in adhesive force as well as the force for adhesion between the antireflection film 36 and the first main surface 36a.

That is, it is estimated from the first experimental example that such a phenomenon that the adhesive force is increased between the antireflection film 36 and the positive-working chemical-amplification resist layer 38, e.g., the bridge reaction or the like occurs by the ultraviolet-ray irradiation and heating at the temperature greater than or equal to the glass transition point and less than the melting point.

While the preferred forms of the present invention have been described, it is to be understood that modifications will be apparent to those skilled in the art without departing from the spirit of the invention. The scope of the invention is to be determined solely by the following claims.

What is claimed is:

1. A method for forming a photoresist pattern, comprising:
    preparing a photoresist structure including an antireflection film provided over a base, and a resist pattern brought into contact with the antireflection film and comprised of a chemical-amplification photoresist provided over the antireflection film;
    applying energy rays; and
    thereafter heating the photoresist structure at a heating temperature greater than or equal to a glass transition point of the resist pattern and less than a melting point thereof,
    the resist pattern and the antireflection film bridge-react with each other responsive to said applying waves and said heating.

2. The method according to claim 1, wherein the heating is performed at a temperature ranging from over 150° C. to under 360° C.

3. The method according to claim 1, wherein a positive-working chemical-amplification photoresist is used as the chemical-amplification photoresist.

4. The method according to claim 1, wherein said applying energy rays is performed using ultraviolet radiation having an arbitrary single wavelength in a wavelength range from 250 to 450 nm.

5. The method according to claim 1, wherein said applying energy rays is performed using ultraviolet radiation having a continuous wavelength extending over a wavelength range from 250 to 450 nm.

6. The method according to claim 1, wherein said applying energy rays is performed using an electron beam.

7. A method for manufacturing a semiconductor device, including the method for forming a photoresist pattern of claim 1, further comprising dry etching the base with the photoresist structure as a mask after the heating.

* * * * *